(12) United States Patent
Li et al.

(10) Patent No.: US 11,245,243 B2
(45) Date of Patent: Feb. 8, 2022

(54) LIGHT-EMITTING CERAMIC AND LIGHT-EMITTING DEVICE

(71) Applicant: APPOTRONICS CORPORATION LIMITED, Guangdong (CN)

(72) Inventors: Qian Li, Guangdong (CN); Yusan Chen, Guangdong (CN); Yanzheng Xu, Guangdong (CN)

(73) Assignee: APPOTRONICS CORPORATION LIMITED, Shenzhen (CN)

( * ) Notice: Subject to any disclaimer, the term of this patent is extended or adjusted under 35 U.S.C. 154(b) by 335 days.

(21) Appl. No.: 16/349,809

(22) PCT Filed: Jun. 16, 2017

(86) PCT No.: PCT/CN2017/088634
§ 371 (c)(1),
(2) Date: Aug. 16, 2019

(87) PCT Pub. No.: WO2018/090614
PCT Pub. Date: May 24, 2018

(65) Prior Publication Data
US 2019/0363507 A1 Nov. 28, 2019

(30) Foreign Application Priority Data
Nov. 15, 2016 (CN) .......................... 201611004965.3

(51) Int. Cl.
*H01S 3/16* (2006.01)
*G02B 1/11* (2015.01)
(Continued)

(52) U.S. Cl.
CPC ............ *H01S 3/1643* (2013.01); *C04B 35/50* (2013.01); *C04B 35/78* (2013.01);
(Continued)

(58) Field of Classification Search
CPC ... C09K 11/7774; H01L 33/502; H01L 33/44; H01L 33/64; C04B 35/50; C04B 37/02;
(Continued)

(56) References Cited

U.S. PATENT DOCUMENTS 7,521,862 B2 * 4/2009 Mueller ............. C09K 11/7774
313/506
8,283,843 B2 * 10/2012 Pan .................... C04B 35/62665
313/112

(Continued)

FOREIGN PATENT DOCUMENTS

CN 102055130 A 5/2011
CN 102718492 A 10/2012
(Continued)

OTHER PUBLICATIONS

Translation for WO 2016/173528, Nov. 3, 2016.*
(Continued)

*Primary Examiner* — C Melissa Koslow
(74) *Attorney, Agent, or Firm* — Marshall, Gerstein & Borun LLP

(57) ABSTRACT

A light-emitting ceramic and a light-emitting device. The light-emitting ceramic comprises a YAG substrate and light-emitting centers and diffusion particles evenly dispersed in the YAG substrate. The light-emitting centers are lanthanide-doped YAG fluorescent powder particles of 10-20 μm in grain size. The particle size of the scattering particles is 20-50 nm. The YAG substrate is a lanthanide-doped YAG ceramic. Also, the grain size of the YAG substrate is less than the grain size of the YAG fluorescent powder particles.

19 Claims, 1 Drawing Sheet

(51) Int. Cl.
| | |
|---|---|
| *C04B 35/78* | (2006.01) |
| *H01L 33/50* | (2010.01) |
| *H01L 33/64* | (2010.01) |
| *C04B 35/50* | (2006.01) |
| *H01L 33/46* | (2010.01) |
| *C09K 11/77* | (2006.01) |

(52) U.S. Cl.
CPC ............ *C09K 11/7774* (2013.01); *G02B 1/11* (2013.01); *H01L 33/46* (2013.01); *H01L 33/502* (2013.01); *H01L 33/641* (2013.01); *C04B 2235/782* (2013.01); *C04B 2235/786* (2013.01); *C04B 2235/95* (2013.01); *C04B 2237/123* (2013.01); *C04B 2237/125* (2013.01); *C09K 11/7715* (2013.01)

(58) Field of Classification Search
CPC ........ C04B 2235/32; C04B 2235/3229; C04B 2235/3235; C04B 2235/32224; C04B 2235/3217; C04B 2235/5472; C04B 2235/5454; C04B 2235/5436; C04B 2235/783; C04B 2235/9646
See application file for complete search history.

(56) References Cited

U.S. PATENT DOCUMENTS 10,216,076 B2 * 2/2019 Irie .................... C09K 11/7721
2011/0089458 A1    4/2011 Hartmann

FOREIGN PATENT DOCUMENTS

| CN | 102782089 A | 11/2012 |
|---|---|---|
| CN | 102803129 A | 11/2012 |
| CN | 203489180 U | 3/2014 |
| CN | 103797294 A | 5/2014 |
| CN | 105762239 A | 7/2016 |
| JP | 2005340240 A | 12/2005 |
| WO | WO-2013189835 A1 | 12/2013 |
| WO | WO 2016/173528 | * 11/2016 |
| WO | WO-2016173528 A1 | 11/2016 |

OTHER PUBLICATIONS

International Search Report for International Application No. PCT/CN2017/088634, dated Sep. 13, 2017.
First Office Action for Application No. CN 201611004965.3 issued by State Intellecutal Property Office of the People's Republic of China, dated Oct. 13, 2020.
Extended European Search Report for Application 17872458.9, dated Jun. 30, 2020.
Shuxing Rsc Li et al: "Al 2 0 3—YAG:Ce composite phosphor ceramic: a thermally robust and efficient color converter for solid state laser lighting", J. Mater. Chem. C J. Mater. Chem. C, pp. 8648-8648, XP55608528, URL:https://pubs.rsc.org/en/content/articl epdf/2016/tc/c6tc03215j, Jan. 1, 2016 (Jan. 1, 2016).
Tang Y et al: "Composite phase ceramic phosphor of A1203-Ce:YAG for high efficiency light emitting", Optics Express, vol. 23, No. 14, pp. 17923-17928, XP002791948, DOI: 10.1364/0E.23.01792313, Jul. 2015 (Jul. 13, 2015).

* cited by examiner

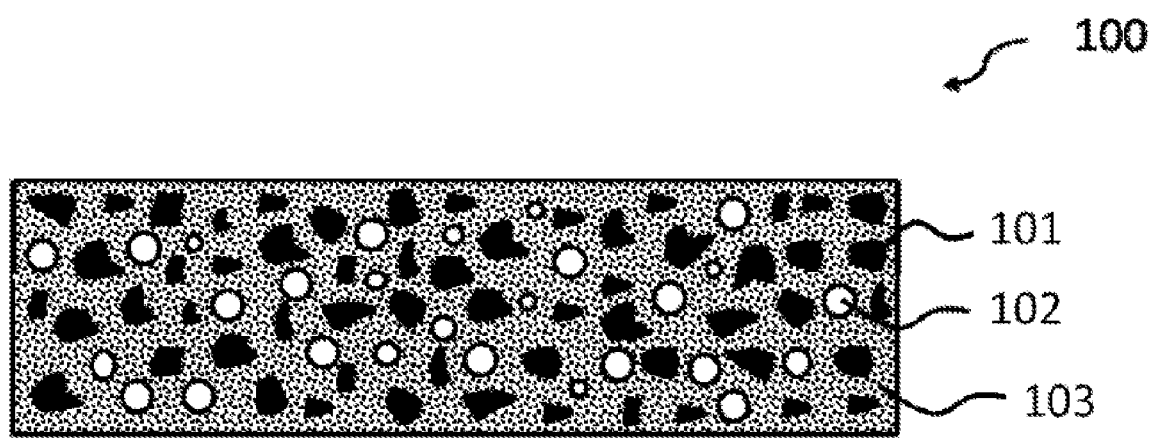

LIGHT-EMITTING CERAMIC AND LIGHT-EMITTING DEVICE

CROSS-REFERENCE TO RELATED APPLICATION

This is the United States national phase of International Patent Application PCT/CN2017/088634, filed Jun. 16, 2017, which claims priority to CN 201611004965.3, filed November 15. The entire contents of each application are incorporated herein by reference.

TECHNICAL FIELD

The present disclosure relates to the field of light-emitting ceramics, and in particular, to a light-emitting ceramic for a high-power light source and a light-emitting device using the light-emitting ceramic.

BACKGROUND

YAG ($Y_3Al_5O_{12}$, yttrium aluminum garnet, abbreviated as YAG) light-emitting ceramics are different from pure phase ceramics of YAG. By doping a lanthanide element such as cerium in YAG, a trace amount of this element replaces a position of partial yttrium, such that the YAG light-emitting ceramic obtains light-emitting properties and can convert incident light into light having a longer wavelength. The traditional YAG:Ce light-emitting ceramics are mainly developed for the light-emitting properties of LED (light emitting diode, LED), and because of the low power of the LED chip, the power density of the emitted blue light is relatively low and thus the power density of yellow light required for synthesizing white light is not high either. Therefore, the light-emitting efficiency of the light-emitting ceramic developed for LED has not received sufficient attention.

In the application of a laser light source, since the laser power is much larger than the LED, light-emitting ceramics need to withstand higher blue light power density and require good heat conduction and uniform light-emitting and so on, in addition, light-emitting ceramics are required to provide yellow light with higher power density so as to achieve white balance of white light, which makes the traditional light-emitting ceramics developed for LED unable to meet the usage requirements.

In addition, the YAG fluorescent ceramics in the prior art are prepared by solid phase sintering or the liquid phase method, in which the doping amount of ceria is very low, and the transmittance rate is high, so that the optical path of the incident excitation light within the ceramic is shortened, thereby making the absorption efficiency of the blue light be lowered, and the light conversion efficiency is relatively low.

Therefore, it is urgent to invent a new type of fluorescent ceramic to improve the light-emitting efficiency of the current transparent fluorescent ceramic and, moreover, to be suitable for high-power excitation light sources such as a laser device.

SUMMARY

It is an object of the present disclosure to provide a new light-emitting ceramic for high-power light sources, particularly for laser light sources, and a light-emitting device using the light-emitting ceramic.

The present disclosure adopts the following technical solutions:

The present disclosure provides a light-emitting ceramic including a YAG substrate and light-emitting centers and scattering particles uniformly dispersed in the YAG substrate, the light-emitting centers being lanthanide element-doped YAG fluorescent powder particles having a grain size of 10-20 μm, the scattering particles having a particle size being 20-50 nm, the YAG substrate being a lanthanide element-doped YAG ceramic, and the YAG substrate having a grain size less than the YAG fluorescent powder particles.

It should be noted that the most critical difference between the light-emitting ceramic of the present disclosure and the existing YAG ceramic lies in: the light-emitting centers, which are lanthanide element-doped YAG fluorescent powder particles of 10-20 μm in grain size, are uniformly dispersed in the YAG substrate; this structure can effectively improve the light-emitting efficiency of the light-emitting ceramic of the present disclosure, thereby meeting the usage demand for a high-power laser light source. It should also be noted that according to the existing YAG ceramic production method, it is impossible to prepare uniformly dispersed light-emitting centers which are YAG particles of 10-20 μm in grain size. An important innovation of the present disclosure is to add, in the preparation process of the light-emitting ceramics, YAG fluorescent powder particles of 10-20 μm in grain size to the raw material for preparing YAG ceramics by the high-temperature solid phase method, such that the prepared light-emitting ceramic is still a YAG ceramic substrate and has uniformly dispersed light-emitting centers which are YAG particles of 10-20 μm in grain size. In addition, in the light-emitting ceramic of the present disclosure, the YAG substrate itself also has light-emitting ability, which is a supplement to the light conversion performance of the light-emitting ceramic and also facilitates fine adjustment of the color coordinates of the light-emitting ceramic. The reason is that the grain size of the YAG substrate is smaller than that of the YAG fluorescent powder particles and the light-emitting efficiency thereof is lower than that of the YAG fluorescent powder particles. Moreover, the YAG substrate is formed in the preparation process to wrap the YAG fluorescent powder particles, and the doping amount of the lanthanide element can be controlled by the raw material selection in the preparation process, thereby changing color coordinates of the emitted light of the light-emitting ceramic.

It should be noted that the refractive index of the scattering particles should be different from the refractive index of the YAG substrate, and only in this way, the incident excitation light can be efficiently scattered when being irradiated onto the scattering particles. After the excitation light is scattered, an optical path of the excitation light in the ceramic becomes longer, thereby improving the light conversion efficiency. Moreover, the particle size of the scattering particle must be smaller than the wavelength of the excitation light in order to meet requirements of Rayleigh scattering, typically about 1/10 of the wavelength. In the present disclosure, blue light is mainly scattered, so that the particle size of the scattering particle is preferably 20-50 nm. In particular, it needs to be noted that scattering particles of Rayleigh scattering are adopted in the present disclosure rather than the scattering particles of Mie scattering in the prior art. In the prior art, the scattering particles of Mie scattering are used, and the particle size of the scattering particle is close to the wavelength of the scattered light, generally 0.5-1 μm, which differs for an order of magnitude from the particle size of the scattering particle in the present disclosure, and this is due to the use of Mie scattering of scattering particles to homogenize the light in the prior art, or to increase light excitation efficiency to some extent; while an object of the present disclosure is to use the Rayleigh scattering of the scattering particles to achieve back scattering of light and thus increase the optical path of the excitation light, thereby increasing the light conversion efficiency.

It should be noted that, in the present disclosure, the light-emitting centers are normally YAG fluorescent powder particles of 10-20 μm. However, in some anomalies or because of some errors, a small number of YAG fluorescent powder particles may have a particle size of 1-10 μm. However, in principle, the light-emitting centers of the present disclosure have a particle size of 10-20 μm.

In one embodiment of the present disclosure, the YAG constituting the YAG substrate has a grain size of 0.5-5 μm.

It should be noted that the grain size of the YAG in the YAG substrate is the grain size of the produced YAG. As mentioned in the background portion, in order to make the light-emitting ceramic have a certain degree of light transmission performance, the degree of grain growth in the YAG will be relatively reduced. That is to say, the light transmission performance of the light-emitting ceramic and the grains are inversely proportional; however, in the light-emitting ceramic of the present disclosure, large-grained YAG fluorescent powder particles are added as the light-emitting centers, therefore, the grain size of the produced YAG can be very small so as to satisfy higher light transmittance performance.

It should be noted that the grain size of the YAG in the YAG substrate of the present disclosure is 0.5-5 μm. However, in the preparation process, some errors will inevitably occur, causing a small part of the grains to grow abnormally, such that a YAG substrate having a particle size of about 5 μm-20 μm is produced. All of these are only a production error or flaw, and in the case of achieving the light transmittance properties of the light-emitting ceramic, the error is not specifically limited in the present disclosure.

In one embodiment of the present disclosure, the YAG substrate is Ce- or Lu-doped YAG, and a doping amount is 0.1%-0.99%; preferably, the doping amount is 0.2%-0.7%.

The doping amount of the present disclosure refers to the molar fraction of Ce or Lu instead of Y element. For a YAG substrate having a doping amount of 0.1%, its chemical formula is $(Y_{0.999}Ce_{0.001})_3Al_5O_{12}$, and for a YAG substrate having a doping amount of 0.2%, its chemical formula is $(Y_{0.999}Ce_{0.002})_3Al_5O_{12}$, and so on.

When the doping amount is less than 0.1%, the light transmittance property of the YAG substrate is too strong and the excitation light that is transmitted without being excited is too much, such that the YAG substrate is unable to emit light efficiently, causing the overall light-emitting efficiency of the light-emitting ceramic to be low. As the doping amount increases, the light-emitting efficiency of the light-emitting ceramic gradually increases. When the doping amount is increased to 0.2%, the overall light-emitting efficiency of the light-emitting ceramic is increased to a relatively stable level. Continuing to increase the doping amount and when the doping amount exceeds 0.7%, the light-emitting efficiency of the light-emitting ceramic begins to decrease significantly. While when the doping amount is higher than 0.99%, the light transmittance property of the YAG substrate is greatly reduced, and after the excitation light is incident on the light-emitting ceramic, the incident depth is relatively shallow, so that the proportion of the excitation light converted into the excited light in the YAG substrate is increased, and whereas the light conversion efficiency of the YAG substrate is lower than that of the YAG fluorescent powder power, thereby lowering the light-emitting efficiency of the light-emitting ceramic.

In the present disclosure, the doping amount of the lanthanide element is controlled by the ratio of the raw materials in the preparation process, and can also be measured by means of quantitative analysis of the components in the prepared light-emitting ceramic product.

In one embodiment of the present disclosure, the YAG fluorescent powder particles are Ce- or Lu-doped YAG fluorescent powder, and the doping amount is 1-5%.

YAG fluorescent powder particles can use the same doping elements as the YAG substrate in order to reduce interface defects between the two; different doping elements can also be selected such that the wavelength ranges of the emitted light are different so as to adjust the color coordinates of the emitted light. In order to improve the light-emitting efficiency of the light-emitting ceramic, in addition to selecting large particles of 10-20 μm as YAG fluorescent powder particles as described above, fluorescent powder with high doping amount can be further selected. The fluorescent powder with a doping amount of 1-5% has relatively high light conversion efficiency and is a light-emitting body of the light-emitting ceramic. By dispersing YAG fluorescent powder particles having a high doping amount in a YAG substrate having a low doping amount and using the YAG substrate having a certain light transmittance rate to guide the excitation light to the respective YAG fluorescent powder particles, the present embodiment avoids the YAG fluorescent powder particles from mutually affecting the light-emitting efficiency after gathering together. In other embodiments of the present disclosure, it is also possible to selectively dope other lanthanide elements to change the spectrum of the emitted light of the light-emitting ceramic. The doping amount (percentage) of the lanthanide element in the YAG substrate is lower than the doping amount (percentage) of the lanthanide element in the YAG fluorescent powder, so as to avoid the waste of excitation light on the YAG substrate ceramic with low light-emitting efficiency and causing the YAG fluorescent powder to take on the main light-emitting function, such that the overall light-emitting efficiency of the light-emitting ceramics is relatively high.

In one embodiment of the present disclosure, the YAG substrate is prepared by solid phase sintering method using $Y_2O_3$, $Al_2O_3$, and one of $CeO_2$ or $Lu_2O_3$ as raw materials.

In one embodiment of the present disclosure, the YAG fluorescent powder particles account for 30%-90% of a total mass of the light-emitting ceramic, and preferably, the YAG fluorescent powder particles account for 50-70% of the total mass of the light-emitting ceramic.

In one embodiment of the present disclosure, the scattering particles account for 1%-10% of a total mass of the light-emitting ceramic; preferably, the scattering particles account for 1.5%-8% of the total mass of the light-emitting ceramic; particularly preferably, the scattering particles account for 2%-5% of the total mass of the light-emitting ceramic.

It should be noted that the scattering particles mainly play a scattering effect on the excitation light, and the higher the content of the scattering particles, the better the scattering effect; however, the transparency of the light-emitting ceramic will be reduced correspondingly. Therefore, it is necessary to select a specific ratio of scattering particles according to actual needs to obtain a better scattering effect and light-emitting ceramic transparency. When the mass fraction of the scattering particles exceeds 5%, the transparency of the light-emitting ceramic begins to decrease significantly and the excitation light of the fluorescent powder particles reaching the light-emitting ceramic away from the excitation light is reduced, so that the light-emitting efficiency of the light-emitting ceramic is lowered. When the mass fraction of the scattering particles exceeds 10%, the light-emitting efficiency of the light-emitting ceramic will become unacceptably low.

It should be noted that the higher the content of YAG fluorescent powder particles, the lower the transmittance rate and the higher the blue light power. According to the research of the present disclosure, when the content of YAG fluorescent powder particles is 10%-40%, it can be applied to LED, and when 30-90%, it is applied to laser. However, it should be additionally noted that the higher the content of YAG fluorescent powder particles, the higher the process requirements.

In one embodiment of the present disclosure, the scattering particles are selected from the group consisting of zirconia, alumina, titania, BN, and combinations thereof.

It should be noted that the thermal conductivity of the above scattering particles is higher than the thermal conductivity of the YAG substrate, and the internal structure of the ceramic will also be affected while the optical path of the excitation light inside the ceramic is changed. By controlling the sintering temperature procedure, the scattering particles of small particles can enter the liquid phase during the sintering process and act as a sintering aid, such that the ceramic becomes denser, and those having a large particle size play a scattering role to enhance the luminous efficiency.

In one embodiment of the present disclosure, the light-emitting ceramic further includes a silver coating layer adhered to one surface of the light-emitting ceramic.

In one embodiment of the present disclosure, the surface of the silver coating layer is further coated with a transition layer and the surface of the transition layer is coated with a copper layer or a solder layer, and the transition layer is a titanium layer or a nickel layer.

In one embodiment of the present disclosure, the light-emitting ceramic of the present disclosure further includes a heat dissipating copper plate, and the heat dissipating copper plate is welded to the surface of the copper layer or the solder layer.

In one embodiment of the present disclosure, the light-emitting ceramic of the present disclosure further includes an antireflection film, while the silver coating layer is adhered to one surface of the light-emitting ceramic and the antireflection film is adhered to another surface of the light-emitting ceramic.

Another aspect of the present disclosure discloses a light emitting device including an excitation light source and the light-emitting ceramic of the present disclosure, wherein the excitation light source is a laser light source.

It should be noted that the light-emitting ceramic of the present disclosure is improved especially for a high-power light source such as a laser, and therefore, it can be effectively applied to a light-emitting device using a laser as an excitation light source.

The beneficial effect of the present disclosure lies in:

The light-emitting ceramic, the YAG substrate and the YAG fluorescent powder particles having a large grain size of the present disclosure can all be used as light-emitting bodies. In addition, the YAG fluorescent powder particles having a large grain size are plump and well-formed, which greatly improves the light-emitting efficiency of the light-emitting ceramics and enables the light-emitting ceramics to meet the usage requirements of high-power light sources having high blue light power density. Since the main phase in the light-emitting ceramic of the present disclosure is a commercially available fluorescent powder phase, the uniformity of light-emitting luminous efficiency is easily controlled, and the luminous efficacy of the sintered ceramic can be achieved.

In the light-emitting ceramic of the present disclosure, YAG fluorescent powder particles having a large grain size and the YAG substrate having a small grain size are interlaced with a pure grain boundary, such that the light-emitting of the light-emitting ceramic is more uniform and the light-homogenizing performance and thermal conductivity are higher than those of the existing system. Moreover, the YAG substrate is used as a bonding medium to bond the YAG fluorescent powder particles having a large grain size, and the color coordinates of the light-emitting ceramic can be adjusted within a certain range by further adjusting the doping content of the lanthanide element in the bonding medium; the doping contents in the YAG substrate and the YAG fluorescent powder particles having a large grain size are different and the fluorescence spectrum ranges are different, and the two complement each other, which improves the color rendering of the excited light. In addition, scattering particles having different refractive indexes are uniformly distributed in the fluorescent ceramic, and the particle size of the scattering particles is 20-50 nm. Rayleigh scattering occurs when the incident excitation light is irradiated onto the scattering particles, so that the excitation light is backward scattered and the optical path of the excitation light in the ceramic becomes longer, thereby improving the utilization of the excitation light and improving the light conversion efficiency of the light-emitting ceramic.

The beneficial effect also lies in: the addition of such scattering particles affect the internal structure of the ceramic while changing the optical path of the incident light inside the ceramic. By controlling the sintering temperature procedure, scattering particles having a small particle size can enter the liquid phase during the sintering process and function as a sintering aid so as to make the ceramic denser, while scattering particles of a large particle size play a scattering role to enhance the luminous efficiency. Moreover, this effect is controllable within a certain range by adjusting the content of the scattering particles; the effect of improving the uniformity of the preparation of the light-emitting ceramic is remarkable.

BRIEF DESCRIPTION OF DRAWINGS

FIG. 1 shows a schematic cross-sectional diagram of a light-emitting ceramic in an embodiment of the present disclosure.

DESCRIPTION OF EMBODIMENTS

As for the conventional fluorescent light-emitting solid encapsulation, such as silica gel-encapsulated fluorescent powder, glass-encapsulated light-emitting glass or the like, their substrate is a light-transmissive silica continuous substrate or a glass continuous substrate and the fluorescent powder is distributed therein. When blue light is incident on the light-emitting body, the blue light can penetrate the transparent substrate and is irradiated on the fluorescent powder particles so as to carry out the energy conversion of photoluminescence, and the generated heat is mainly transmitted out through the continuous structure of the fluorescent powder-substrate. However, silica gel and glass have the disadvantages of low heat resistance and poor thermal conductivity. When used in a high-power laser light source, the silica gel system may be aged and become brittle due to excessive temperature, and may even be burned; although the heat resistance of the glass system is better, the thermal conductivity is low, and the sharply rising temperature will still cause a significant decrease in the efficiency of the fluorescent powder.

The YAG ceramic has good thermal conductivity. However, the YAG ceramic prepared by the existing preparation method has a relatively small grain growth size, and the light-emitting efficiency thereof is much lower than the commercial YAG fluorescent powder particles having a large grain size. However, if the YAG ceramic is directly fired using commercial YAG fluorescent powder particles having a large grain size, the sintering effect is poor due to the particles are too large, and there are too many voids caused by the large particles; moreover, it is difficult to prepare and it is required to burn the fluorescent powder having a large particle size to a molten state at an extremely high temperature; however, such high-temperature treatment also destroys the surface morphology of the fluorescent powder particles, thereby causing the light-emitting efficiency to decrease significantly. Therefore, a YAG ceramic cannot be directly fired using YAG fluorescent powder particles having a large grain size.

Therefore, the present disclosure creatively proposes to add commercial YAG fluorescent powder particles having a large grain particle size and scattering particles to the raw material of the YAG ceramic. The sintering temperature of the YAG ceramic is insufficient to burn the fluorescent powder particles having a large particle size to a molten state during vacuum sintering, such that in the finally prepared YAG light-emitting ceramic, the large grain size is preserved. Moreover, by controlling the sintering temperature procedure, scattering particles having a small particle size can enter the liquid phase during the sintering process and function as a sintering aid so as to make the ceramic denser, while scattering particles having a large particle size play a scattering role to enhance the luminous efficiency. Moreover, this effect is controllable within a certain range by adjusting the content of the scattering particles; the effect of improving the uniformity of the preparation of the light-emitting ceramic is remarkable.

A cross-sectional view of the light-emitting ceramic according to the present disclosure is shown in FIG. 1.

FIG. 1 shows a schematic view of a light-emitting ceramic 100. The YAG substrate 103 produced by sintering a YAG ceramic raw material has a grain size of 0.5-5 The YAG substrate uniformly wraps therein the YAG fluorescent powder particles 101 having a particle size of 10-20 μm and the scattering particles 102 having a particle size of 20-50 nm. The YAG substrate is Ce-doped YAG or Lu-doped YAG, and the doping amount is 0.1%-0.99%; preferably, the doping amount is 0.2%-0.7%. The YAG fluorescent powder particles 101 are Ce-doped YAG or Lu-doped YAG fluorescent powder, and the doping amount is 1-5%.

The present disclosure is further described in detail below by way of specific embodiments. The following examples are only intended to further illustrate the present disclosure and are not to be construed as limiting the present disclosure.

In this embodiment, the YAG substrate of the light-emitting ceramic is prepared by using $Y_2O_3$, $Al_2O_3$ and $CeO_2$ as raw materials, in which there are YAG fluorescent powder particles having a particle size of 10-20 μm and scattering particles having a particle size of 20-50 nm, as described in detail below.

The following substances are selected as raw materials: $Y_2O_3$ having a purity of 99.99% and a particle size of 0.05-1 μm; $Al_2O_3$ having a purity of 99.99% and a particle size of 0.05-1 μm; $CeO_2$ having a purity of 99.99% and a particle size of 0.1-1 μm; commercial YAG fluorescent powder particles having a particle size of 10-20 μm; scattering particles having a purity of 99.99% and a particle size of 20-50 nm, and the scattering particles are selected from the group consisting of zirconia, alumina, titania, BN, and combinations thereof.

Step 1: powder preparation: mixing the alumina and yttria powder raw materials with a molar ratio of Y:Al being 3:5, and then adding $CeO_2$ powder according to the Ce molar doping percentage of 0.1%-0.99%, using anhydrous ethanol as the liquid medium, adding 1%-5% PVA or PVB as binder, and putting them into a ball mill jar for ball milling and mixing, after ball milling for 4-8 h, adding commercial fluorescent powder having a ratio of 30%-90% and scattering particles having a ratio of 1%-10% with the scattering particles selected from the group consisting of zirconia, alumina, titania, BN, and combinations thereof (specifically alumina having a particle size of 20-50 nm in this example), continuing ball milling for 30-60 minutes; drying at 80° C. to remove ethyl alcohol, and after separating the powder material out and carrying out grinding and sifting, the preliminary powder preparation stage is completed;

Step 2: tabletting: placing the prepared powder in a mold to be flattened; and applying pressure of 80-100 kg/cm$^2$ to enable the molding to be formed; taking out the molded blank and leaving aside;

Step 3: high temperature degreasing and binder-removing: putting the molded blank into a high temperature degreasing furnace, keeping warm for 5-10 h at a temperature at which the binder (PVB or PVA) decomposes, and the binder-removing time is determined according to the volume of the blank;

Step 4: cold isostatic pressing: vacuum-encapsulating the sample that has been binder-removed and placing it in a hydraulic chamber for cold isostatic pressing, maintaining at a pressure of 250 Mpa-300 Mpa for 1 minute, and then taking out the sample and leaving aside;

Step 5: vacuum sintering: placing the sample in a vacuum tungsten coil furnace, and keeping warm for 4-10 hours with the vacuum degree being within $10^{-4}$ Pa and the temperature being within the range of 1500° C.-1800° C., and the sintering is completed After the illuminating ceramic prepared in this example is subjected to rough grinding, fine grinding, polishing and cutting, a light-emitting device of a laser light source is prepared. Further, a layer of silver is coated on the back face of the light-emitting ceramic of this example, and the silver layer mainly functions as a reflection film to reflect the blue light, visible light, and the like which are incident on the back face. A transition layer Ti or Ni is further coated on the silver, and a layer of copper or solder is further coated thereon, and then the light-emitting body of the light-emitting ceramic of this example is welded to the copper base by welding. In addition, in order to further reduce the reflection of the laser on the ceramic surface, the light-emitting ceramic of this example is added with a layer of blue light antireflection film after polishing, so as to increase the amount of the laser transmitted.

As for the light-emitting ceramic prepared in this example, when the content of large YAG fluorescent powder particles is in the range of 50%-70%, due to the light-emitting centers having a large grain size, the light-emitting efficiency is improved, and there is no miscellaneous phase, the grain boundary is pure and the light-homogenizing performance is good, therefore it is able to satisfy usage requirement of a high-power light source such as a laser; moreover, since the scattering particles are added, when the incident excitation light is irradiated onto the scattering particles, the excitation light is scattered; after the excitation light is scattered, the optical path of the excitation light in the ceramic becomes longer, thereby improving the light conversion efficiency.

In the preparation scheme adopted in this example, the YAG substrate is doped with Ce having a percentage of 0.1%-0.99%, while in other embodiments, Lu is doped, so that the YAG substrate can also emit light, serving as supplementary light-emitting of the light-emitting ceramic. In this embodiment, the YAG substrate is used as a bonding medium to bond YAG fluorescent powder particles having a large grain size, and the color coordinate of the light-emitting ceramic can be adjusted within a certain range by further adjusting the doping content of Ce or Lu in the bonding medium; the doping contents in the YAG substrate and the YAG fluorescent powder particles having a large grain size are different and the fluorescence spectrum ranges are different, and the two complement each other, which improves the color rendering of the excited light. In addition, scattering particles having high refractive indexes are uniformly distributed in the fluorescent ceramic, and when the incident excitation light is irradiated onto the scattering particles, the excitation light is scattered; after the excitation light is scattered, the optical path of the excitation light in the ceramic becomes longer, thereby improving the light conversion efficiency.

It should be noted that, in the preparation process of the light-emitting ceramic of this example, the doping element Ce can be replaced by Lu, as long as $CeO_2$ powder is replaced with $Lu_2O_3$ as raw material according to a preset ratio.

In other embodiments, when one of or a combination of more of zirconia, alumina, titania, BN or the like is used as the scattering particles, it is only necessary to directly add the corresponding raw materials in accordance with the predetermined ratio when preparing powder in the Step 1.

The light-emitting efficiency of the light-emitting ceramic prepared in this example is tested. Under the same power, the larger the content of YAG fluorescent powder particles having a large particle size, the higher the light-emitting efficiency. Generally, for the same light-emitting ceramic, as the power of the excitation light increases, the light-emitting efficiency gradually decreases. However, for a light-emitting ceramic having a relatively large content of YAG fluorescent powder particles having a large particle size, the decrease in light-emitting efficiency is relatively small as the power is increased. Therefore, when the content of the YAG fluorescent powder particles having a large particle size prepared in this example is 50%-70%, the unit power density received by the light-emitting ceramic gradually increases as the power is gradually increased, and although the light-emitting efficiency will still be reduced somewhat, the decrease in light-emitting efficiency is relatively small as the power is increased, for the reason that there are relatively more light-emitting centers having a large grain size, the light-emitting efficiency decreases with the increase of power; in addition, there is no miscellaneous phase, and the grain boundary is pure and the light-homogenizing performance is good, therefore it is able to meet the usage needs of high-power light sources such as a laser.

The present disclosure also provides a light-emitting device including an excitation light source and the light-emitting ceramic described above, the excitation light source is a laser light source, and high-brightness light is generated by the excitation light source being irradiated on the light-emitting ceramic. The light-emitting device can be applied to the field of illumination such as road lamps, automobile headlights, etc., and can also be applied to the field of display, such as the field of projection. In the light-emitting device, the light-emitting ceramic can also be made into a movable device, such as a color wheel, so that the excitation light emitted from the excitation light source is incident on the rotating color wheel to generate an excited light.

The above content is a further detailed description of the present disclosure in conjunction with the specific embodiments, and the specific implementation of the present disclosure is not limited to the description. For those skilled in the art to which the present disclosure pertains, a number of simple deductions or substitutions may be made without departing from the concept of the present disclosure.

What is claimed is:

1. A light-emitting ceramic, wherein the light-emitting ceramic comprises a YAG substrate and light-emitting centers and scattering particles uniformly dispersed in the YAG substrate, the light-emitting centers being lanthanide element doped YAG fluorescent powder particles having a grain size of 10-20 μm, the scattering particles having a particle size of 20-50 nm, the YAG substrate being a lanthanide element doped YAG ceramic, and the YAG substrate having a smaller grain size than the YAG fluorescent powder particles.

2. The light-emitting ceramic according to claim 1, wherein the YAG substrate is constituted of YAG having a grain size of 0.5-5 μm.

3. The light-emitting ceramic according to claim 1, wherein the YAG substrate is Ce- or Lu-doped YAG, and a doping amount is 0.1%-0.99%.

4. The light-emitting ceramic according to claim 1, wherein the YAG substrate is Ce- or Lu-doped YAG, and a doping amount is 0.2%-0.7%.

5. The light-emitting ceramic according to claim 3, wherein the YAG fluorescent powder particles are Ce- or Lu-doped YAG fluorescent powder, and the doping amount is 1-5%.

6. The light-emitting ceramic according to claim 1, wherein the YAG fluorescent powder particles account for 30%-90% of a total mass of the light-emitting ceramic.

7. The light-emitting ceramic according to claim 1, wherein the YAG fluorescent powder particles account for 50%-70% of a total mass of the light-emitting ceramic.

8. The light-emitting ceramic according to claim 1, wherein the scattering particles account for 1%-10% of a total mass of the light-emitting ceramic.

9. The light-emitting ceramic according to claim 1, wherein the scattering particles account for 1.5%-8% of a total mass of the light-emitting ceramic.

10. The light-emitting ceramic according to claim 1, wherein the scattering particles account for 2%-5% of a total mass of the light-emitting ceramic.

11. The light-emitting ceramic according to claim 1, wherein the scattering particles are selected from a group consisting of zirconia, alumina, titania, BN, and combinations thereof.

12. The light-emitting ceramic according to claim 1, further comprising a silver coating layer adhered to one surface of the YAG substrate, a surface of the silver coating layer being further coated with a transition layer and a surface of the transition layer being coated with a copper layer or a solder layer, and the transition layer being a titanium layer or a nickel layer.

13. The light-emitting ceramic according to claim 12, further comprising a heat dissipating copper plate, wherein the heat dissipating copper plate is welded to a surface of the copper layer or a surface of the solder layer.

14. The light-emitting ceramic according to claim 13, further comprising an antireflection film, wherein the silver coating layer is adhered to one surface of the YAG substrate and the antireflection film is adhered to another surface of the YAG substrate.

15. A light-emitting device comprising an excitation light source and a light-emitting ceramic, wherein the excitation light source is a laser light source,
the light-emitting ceramic comprises a YAG substrate and light-emitting centers and scattering particles uniformly dispersed in the YAG substrate, the light-emitting centers being lanthanide element doped YAG fluorescent powder particles having a grain size of 10-20 µm, the scattering particles having a particle size of 20-50 nm, the YAG substrate being a lanthanide element doped YAG ceramic, and the YAG substrate having a smaller grain size than the YAG fluorescent powder particles.

16. The light-emitting device according to claim 15, wherein the YAG substrate is constituted of YAG having a grain size of 0.5-5 µm.

17. The light-emitting device according to claim 15, wherein the YAG substrate is Ce- or Lu-doped YAG, and a doping amount is 0.1%-0.99%.

18. The light-emitting device according to claim 17, wherein the YAG fluorescent powder particles are Ce- or Lu-doped YAG fluorescent powder, and the doping amount is 1-5%.

19. The light-emitting device according to claim 15, wherein the YAG fluorescent powder particles account for 30%-90% of a total mass of the light-emitting ceramic.

* * * * *